United States Patent [19]
Li et al.

[11] Patent Number: 5,792,692
[45] Date of Patent: Aug. 11, 1998

[54] METHOD OF FABRICATING A TWIN HAMMER TREE SHAPED CAPACITOR STRUCTURE FOR A DRAM DEVICE

[75] Inventors: Jian-Xun Li; Simon Chooi; Mei-Sheng Zhou, all of Singapore, Singapore

[73] Assignee: Chartered Semiconductor Manufacturing, Ltd., Singapore, Singapore

[21] Appl. No.: 912,323

[22] Filed: Aug. 18, 1997

[51] Int. Cl.[6] .................. H01L 21/8242; H01L 21/20
[52] U.S. Cl. .................... 438/253; 438/254; 438/397
[58] Field of Search ...................... 438/238, 239, 438/253, 254, 381, 396, 397; 257/306, 307, 308

[56] References Cited

U.S. PATENT DOCUMENTS

| | | | |
|---|---|---|---|
| 5,137,842 | 8/1992 | Chan et al. | 438/254 |
| 5,554,557 | 9/1996 | Koh | 438/255 |
| 5,583,069 | 12/1996 | Ahn et al. | 437/52 |
| 5,700,731 | 12/1997 | Lin et al. | 438/254 |

*Primary Examiner*—Joni Chang
*Attorney, Agent, or Firm*—George O. Saile; Stephen B. Ackerman

[57] ABSTRACT

A process for fabricating a large surface area, storage node structure, for a DRAM device, has been developed. The storage node structure is comprised of a lower level polysilicon structure, exhibiting a "twin hammer tree" shape, and connected to an upper polysilicon level, exhibiting a "branch" type shape. The fabrication process used to create this storage node structure, features various deposition procedures, used for insulator and polysilicon layers, and various anisotropic and isotropic, dry etch procedures, as well as wet etch procedures, used for creation of the "twin hammer tree" shaped structure.

23 Claims, 13 Drawing Sheets

METHOD OF FABRICATING A TWIN HAMMER TREE SHAPED CAPACITOR STRUCTURE FOR A DRAM DEVICE

BACKGROUND OF THE INVENTION

1. Field of the Invention

The present invention relates to methods used to create capacitor structures for a dynamic random access memory, (DRAM), device

2. Description of the Prior Art

The semiconductor industry is continually striving to increase DRAM density. The ability to fabricate DRAM cells with densities of 64 Mb or greater, with adequate performance or signal, is greatly dependent on the type of capacitor structure used for the DRAM device. In order to achieve the desired DRAM capacitance the semiconductor industry has extensively used a stacked capacitor structure, overlying the transfer gate transistor, of the DRAM device. The signal, or capacitance, achieved is a function of the thickness of the dielectric layer of the capacitor, as well as a function of the amount of capacitor surface area. Since reliability concerns limit the thickness that the capacitor dielectric layer can be decreased, the desired capacitance increases have to be addressed by novel capacitor structures, offering increased surface area.

One method of increasing surface area for a DRAM stacked capacitor, (STC), structure has been described by Koh, in U.S. Pat. No. 5,554,557. This invention shows an STC structure exhibiting a lower electrode, featuring a hemispherical grained, (HSG), silicon layer. The HSG layer, comprised of convex and concave features, results in surface area increases, when compared to counterparts fabricated using a polysilicon layer, with a smooth surface, for a lower electrode structure. The amount of surface area increase using HSG silicon is dependent on the level of roughness of the layer, which in turn is dependent on the conditions used to create the HSG layer. This process can be difficult to control, and thus reproducibility of STC capacitance, and signal, can be difficult to achieve.

This invention will illustrate a process for fabricating a STC structure, featuring a lower electrode, or storage node, with increased surface area resulting from the creation of a "twin hammer tree" shaped, storage node configuration. The invention will also describe fabrication procedures used to create extensions, or "branches", for the "twin hammer tree" shaped, storage node structure, used to further increase surface area. Thus this invention will offer increased surface area increases, for DRAM capacitor structures, without the use of HSG silicon layer.

SUMMARY OF THE INVENTION

It is an object of this invention to increase the capacitance of a DRAM device by increasing the surface area of the storage node structure, of the DRAM device.

It is another object of this invention to develop a process for creating a storage node structure, with a "twin hammer tree" shape, to increase the surface area of the storage node electrode.

It is still another object of this invention to develop a process for adding "branches" or extensions, to the "twin hammer tree" shaped, storage node structure, to further increase surface area.

In accordance with the present invention a method of creating a "twin hammer tree" shaped, storage node structure, for a STC DRAM device, has been developed. A thick dielectric layer, with an overlying silicon nitride layer, are deposited on an underlying transfer gate transistor. A multi-layered stack, comprised of an overlying second silicon oxide layer, a first polysilicon layer, and an underlying first silicon oxide layer, (or a silicon nitride or silicon oxynitride layer), is formed on the silicon nitride layer. A storage node contact hole is next formed, via dry etching procedures, in the multi-layered stack, in the silicon nitride layer, and in the thick dielectric layer, exposing the top surface of a source and drain region, of the transfer gate transistor. The dry etching procedures, used to etch the second silicon oxide layer of the multi-layered stack, can be adjusted to create either a 90°0 straight walled profile, a 45° straight walled isotropic profile, or a rounded isotropic profile, in the second silicon oxide layer. A second polysilicon layer is deposited, completely filling the storage node contact hole. An etchback procedure, of the second polysilicon layer, results in the formation of a polysilicon plug, in the storage node contact hole, with the polysilicon plug exhibiting protruding polysilicon shapes, in a region in which the second polysilicon layer butted against the sides of the second silicon oxide layer. The etchback procedure also results in the formation of polysilicon spacers, on the outside sidewalls of the multi-layered stack, with the polysilicon spacers and polysilicon plug, connected by the first polysilicon layer, in the multi-layered stack. Removal of the second silicon oxide layer, from the multi-layered stack, results in a "twin hammer tree" shaped polysilicon storage node structure, comprised of the polysilicon plug, in the storage node contact hole, and connected on each side to a "hammer" type shape, comprised of a polysilicon spacer, at the end of a polysilicon slab, originally formed from the first polysilicon layer. Formation of a capacitor dielectric layer, completely interfacing all exposed surfaces of the "twin hammer tree" shaped polysilicon storage node structure, is followed by the deposition and patterning, of a third polysilicon layer, creating a STC structure, featuring a "twin hammer tree" shaped, storage node structure.

A second iteration of this invention is to create a "twin hammer tree" shaped, storage node structure, with polysilicon "branches" to further increase storage node surface area. After forming the "twin hammer tree" polysilicon shape, a third silicon oxide layer is deposited on the "twin hammer tree" shaped polysilicon structure, followed by patterning to open a hole in the third silicon oxide layer, exposing a region of the underlying, "twin hammer tree" shaped polysilicon structure. A third polysilicon layer is deposited, and patterned, to create a polysilicon "branch" on the underlying third silicon oxide layer, contacting the underlying "twin hammer tree" polysilicon shape, in the hole opening in the third silicon oxide layer. Removal of the third silicon oxide layer results in a storage node structure comprised of a polysilicon branch, connected to, and overhanging the underlying "twin hammer tree" shaped, polysilicon shape. Additional overhanging levels of polysilicon "branches" can be created, if desired, using the identical process. Formation of a capacitor dielectric layer, on the exposed surfaces of the multi-branched, "twin hammer tree" shaped, storage node structure, followed by formation of an upper polysilicon electrode structure, complete the formation of the STC structure.

A third iteration of this invention consists of applying a spin on glass, (SOG), layer, after creation of the multi-layered stack, creating a planar topography. Creation of the storage node contact hole, and polysilicon deposition, used to fill the storage node contact hole, can now be followed by a chemical mechanical polishing procedure, or by a polysilicon etch back procedure, used to remove unwanted polysilicon from the top surface of the SOG layer, creating the polysilicon plug, in the storage node contact hole. Removal of the SOG layer is then followed by the processing sequences described for the first and second iterations of this invention, again creating "twin hammer tree" shaped, or multi-branched, "twin hammer tree" shaped, storage node structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating a capacitor structure, for a DRAM device, in which the surface area of the storage node structure has been increased by creating a "twin hammer tree" shaped structure, will now be described in detail.

Figure 1:
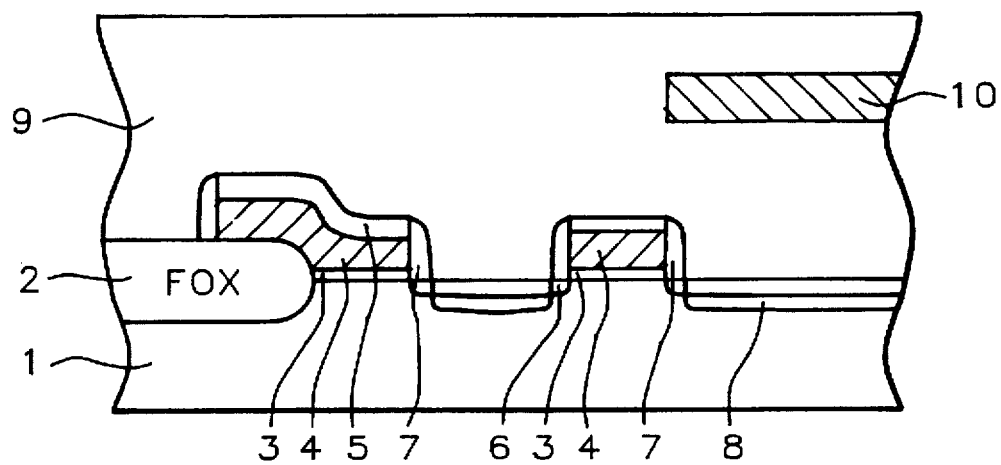
FIGS. 1–4, 5a–5c, 6a–6b, 7–9, which schematically, in cross-sectional style, show the key fabrication stages for a first embodiment of this invention.

FIG. 1, schematically shows a transfer gate transistor, on a P type semiconductor substrate 1, with a thick field oxide, (FOX), region 2, or an insulator filled shallow trench, is used for isolation purposes. The transfer gate transistor is comprised of a thin gate insulator layer 3, of silicon dioxide, with a polysilicon gate structure 4, covered by a capping insulator layer 5. Lightly doped, N type, source and drain regions 6, insulator sidewall spacers 7, and heavily doped source and drain regions 8, are also shown schematically in FIG. 1, as part of the transfer gate transistor. An initial borophosphosilicate, (BPSG), layer is deposited on the transfer gate transistor using either low temperature chemical vapor deposition, (LPCVD), plasma enhanced chemical vapor deposition, (PECVD), atmospheric pressure chemical vapor deposition, (APCVD), or subatmospheric chemical vapor deposition, (SACVD), procedures. A polysilicon bit line structure 10, is then formed, (contacting a source and drain region, not shown in FIG. 1), followed by the completion of the BPSG deposition procedure, resulting in BPSG layer 9, with a total thickness between about 6000 to 24000 Angstroms. Planarization of BPSG layer 9, is performed using either chemical mechanical polishing, (CMP), reflow, reflow followed by CMP, or reflow followed by an etch back procedure, all procedures creating a desired, smooth top surface topography.

Figure 2:
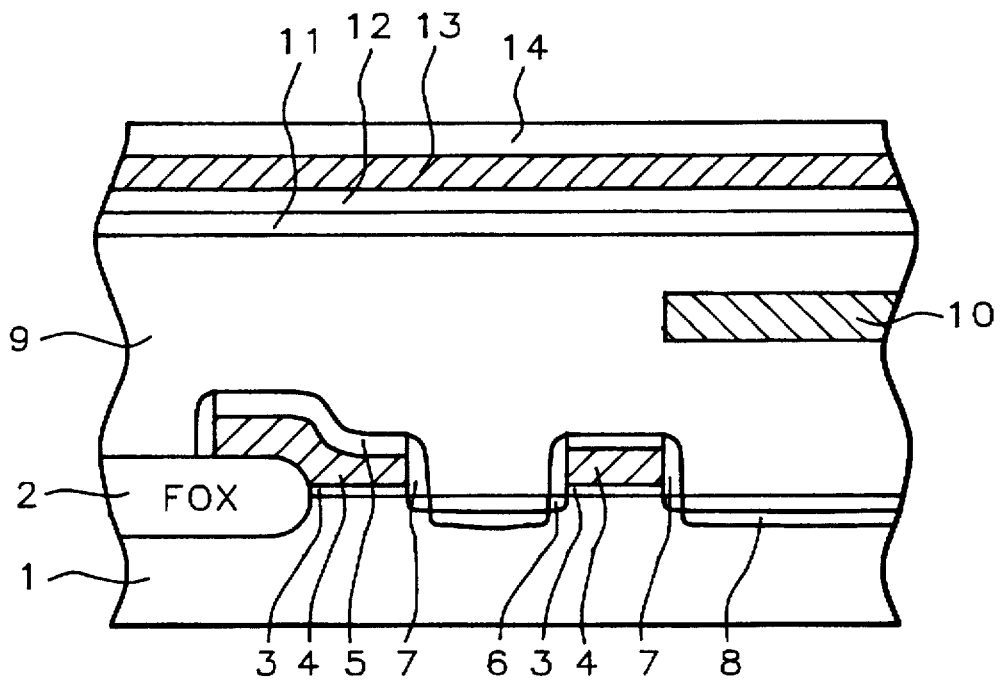

A multi-layered stack is next deposited on BPSG layer 9, and schematically shown in FIG. 2. First a silicon nitride layer 11, is deposited, using either LPCVD or PECVD procedures, to a thickness between about 1000 to 2500 Angstroms. Next a first silicon oxide layer 12, is deposited, again using either LPCVD, PECVD, APCVD or SACVD procedures, to a thickness between about 1000 to 4,000 Angstroms. Silicon oxynitride, or silicon nitride, can be substituted for first silicon oxide layer, if desired. A first polysilicon layer 13, is next deposited, using LPCVD procedures, to a thickness between about 500 to 2500 Angstroms. Polysilicon layer 13 is deposited using in situ doping procedures, or is grown intrinsically and doped via ion implantation procedures. Finally a second silicon oxide layer 14, is deposited, again via either LPCVD, PECVD, APCVD, or SACVD procedures, to a thickness between about 1500 to 4000 Angstroms.

Figure 3:
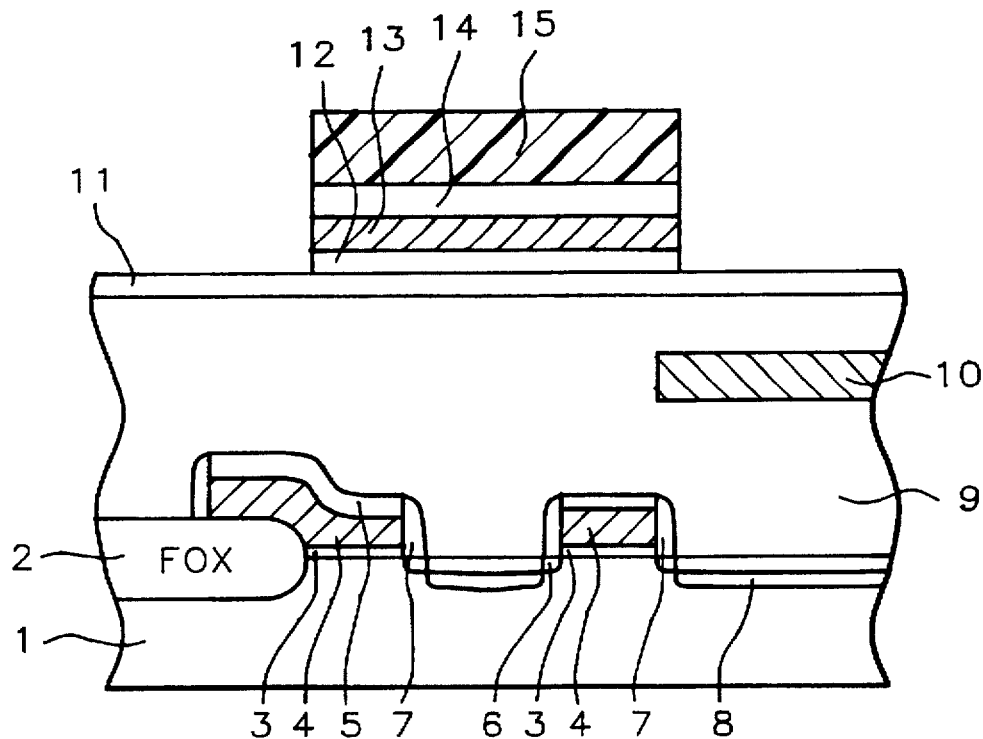
Figure 4:
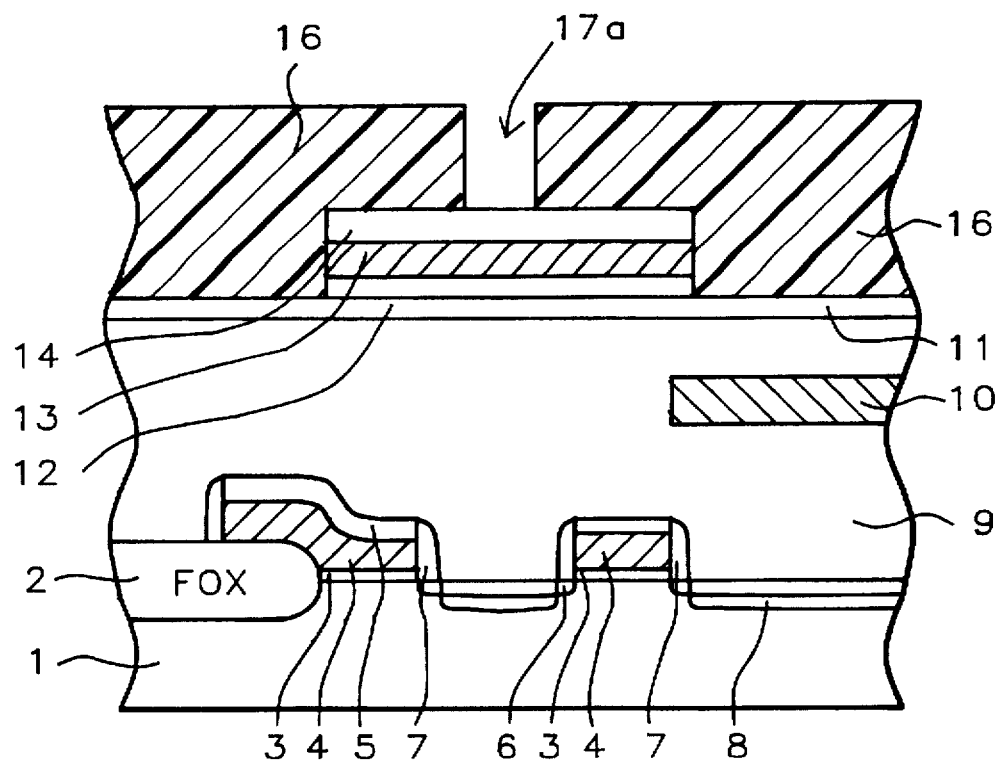

A photoresist shape 15, is used as a mask to define a multi-level stack structure, using anisotropic reactive ion etching, (RIE), procedures. The RIE procedure uses a single fluorocarbon gas, or a mixture of fluorocarbon gases chosen from a group that includes $CHF_3$, $CF_4$, $C_2F_6$, $C_3F_8$, and $C_4F_8$, as an etchant for second silicon oxide layer 14, and the first silicon oxide layer 12, while using $Cl_2$ or a fluorine based gas, such as $CF_4$, $SF_6$, $NF_3$, or a mixture of these, as an etchant for first polysilicon layer 13. The etch rate of silicon nitride layer 11, in the fluorocarbon etchants is small, therefore silicon nitride layer 11, serves as an etch stop for the RIE procedure. The result of the RIE procedure is schematically shown in FIG. 3. After removal of photoresist shape 15, via plasma oxygen ashing and careful wet cleans, another photoresist shape 16, is formed on the multi-layered stack structure. An opening 17a, in photoresist shape 16, with a diameter between about 0.25 to 1.0 micrometers, will be used to form a subsequent storage node contact hole. This is schematically shown in FIG. 4.

Figure 5A:
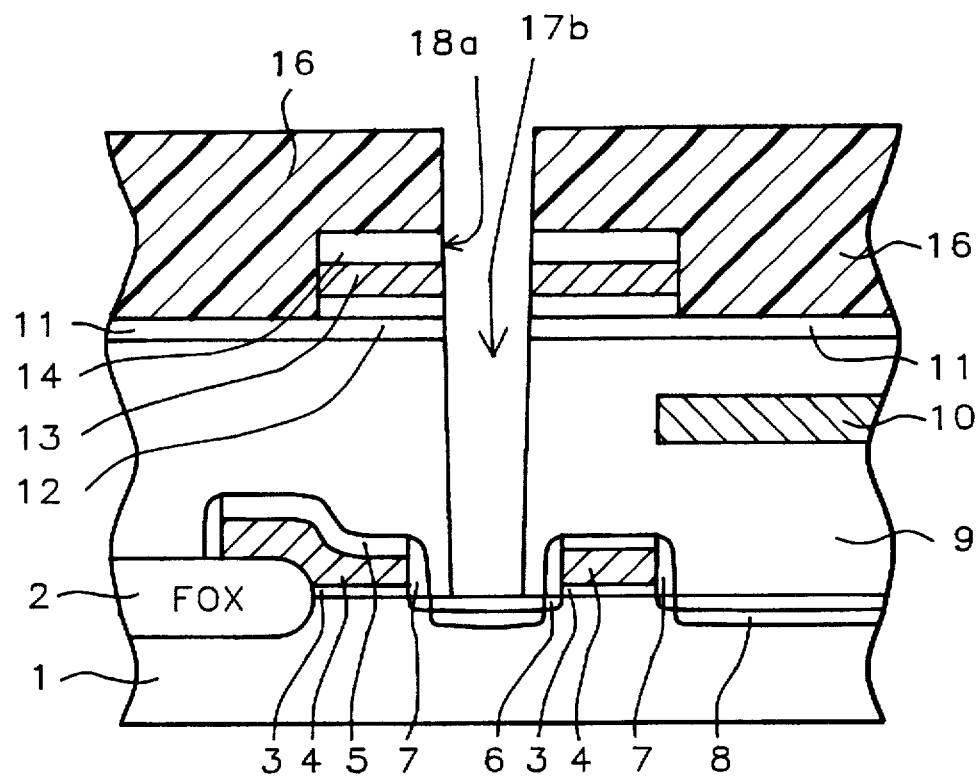
Figure 5B:
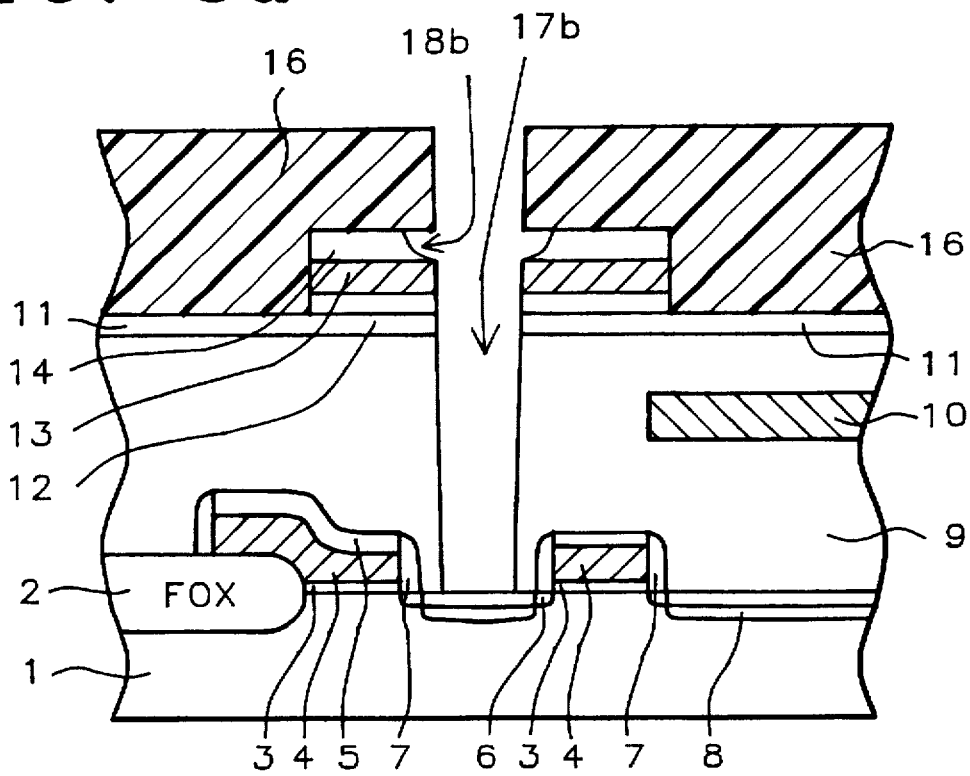
Figure 5C:
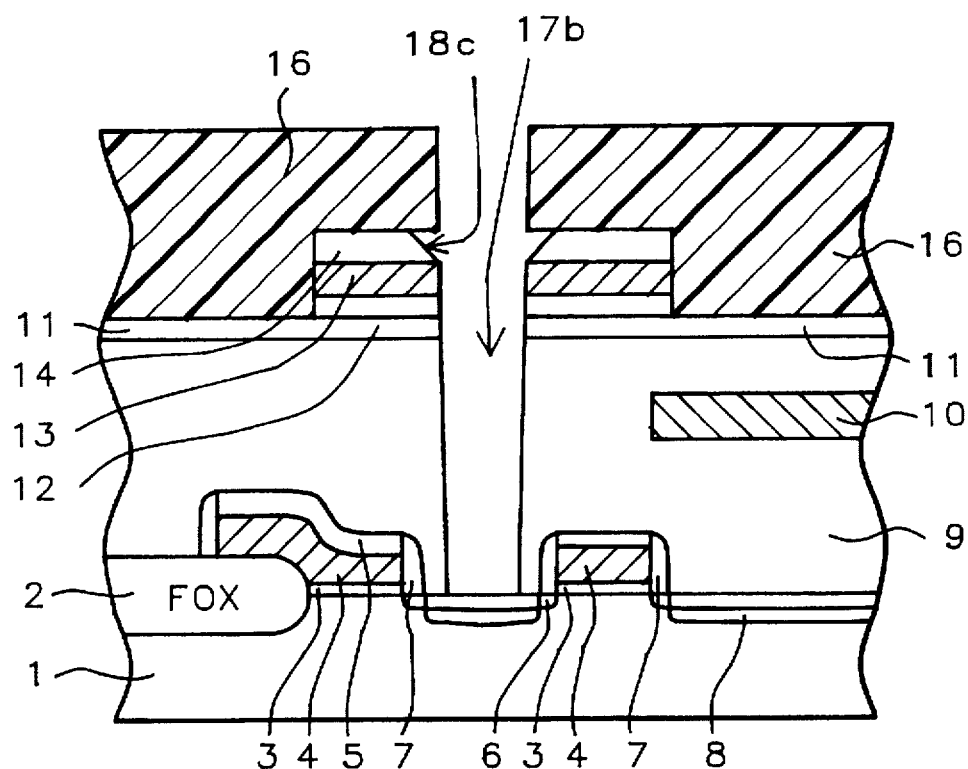

FIGS. 5a–5c, schematically show the creation of storage node contact hole 17b, using RIE procedures. In FIG. 5a, an opening in second silicon oxide layer 14, was formed via an anisotropic RIE procedure, using a single fluorocarbon gas, or a mixture of fluorocarbon gases chosen from a group that includes $CHF_3$, $CF_4$, $C_2F_6$, $C_3F_8$, or $C_4F_8$, as an etchant, creating straight walled, anisotropic profile 18a, of about 90° in second silicon oxide layer 14. In FIG. 5b, an isotropic RIE procedure, using $CF_4$, $SF_6$, or $NF_3$, as an etchant, at a pressure greater than 1000 milliTorr, is used to create a rounded isotropic profile 18b, in second silicon oxide layer 14, while FIG. 5c, shows the result of another isotropic RIE procedure, using $CF_4$, $SF_6$, $NF_3$, or $CHF_3$, as an etchant, at a pressure between about 600 to 1000 millitorr, creating a straight walled, isotropic profile 18c, of about 45° in second silicon oxide layer 14. The different profiles are obtained using pressures, recipes, and tools, specific to the desired profile. The remaining procedure for the opening of storage contact hole 17b, is similar for all three silicon oxide profiles. An anisotropic RIE, or high density plasma etching procedure is employed, using $Cl_2$ or a fluorine based gas, as an etchant for first polysilicon layer 13, while again using a single fluorocarbon gas, or a mixture of fluorocarbon gases, as an etchant for first silicon oxide layer 12, as well as for the etchant for silicon nitride layer 11, and BPSG layer 9. Storage contact hole 17b, between about 0.25 to 1.0 micrometers in diameter, exposes the top surface of source and drain region 8, schematically shown in FIGS. 5a–5c. The remainder of this invention will be described using the straight walled, isotropic profile 18c, in second silicon oxide layer 14.

Figure 6A:
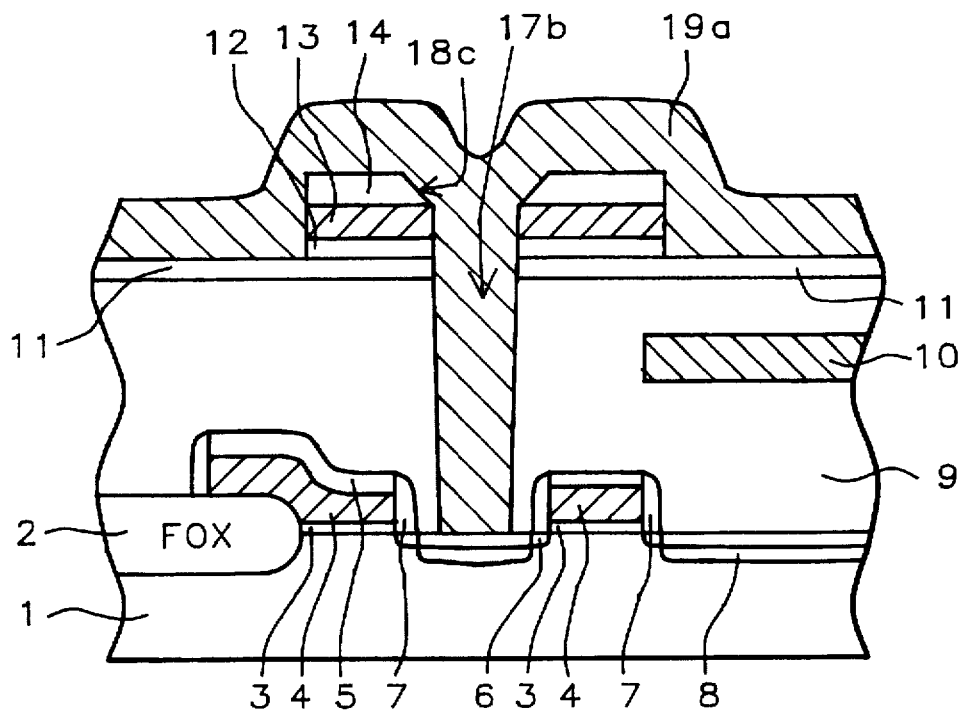
Figure 6B:
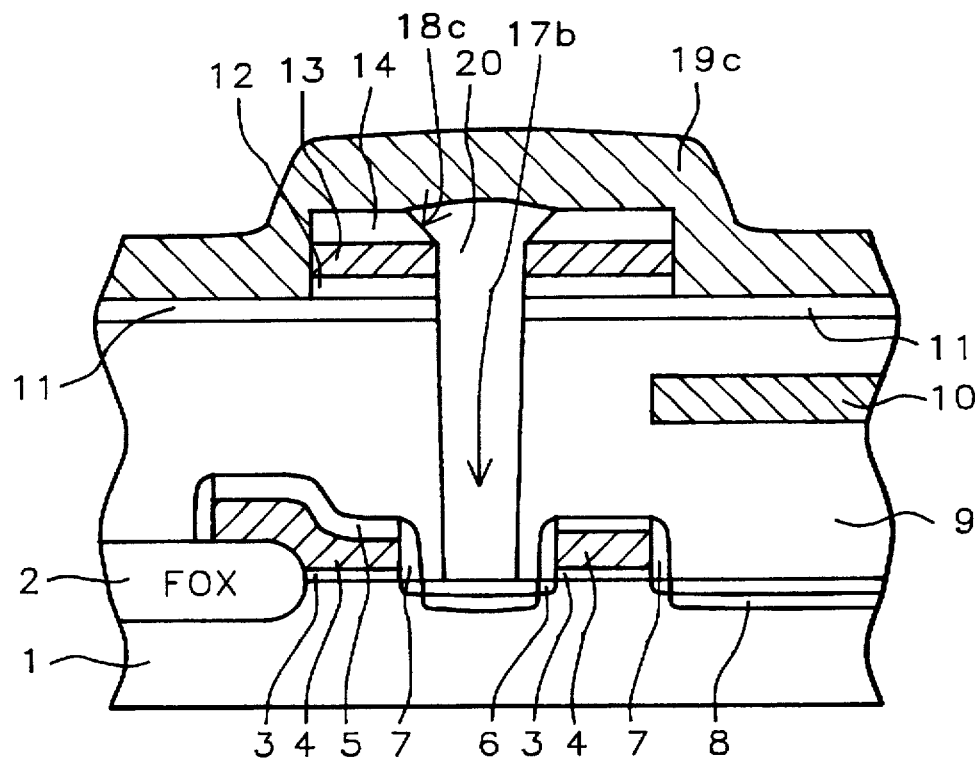

After removal of photoresist shape 16, using plasma oxygen ashing and careful wet cleans, a second polysilicon layer 19a, is deposited via LPCVD procedures, using in situ doping procedures, to a thickness between about 1500 to 5000 Angstroms. Second polysilicon layer 19a, shown schematically in FIG. 6a, completely fills storage node contact hole 17b. FIG. 6b, schematically shows a different method for filling storage contact hole 17b. A deposition of in situ doped polysilicon 20, selectively deposits only in storage node contact hole 17b, followed by the deposition of an overlying, in situ doped polysilicon layer 19c, obtained via an LPCVD procedure, at a thickness between about 1000 to 5000 Angstroms. The remainder of this invention will be described using only the second polysilicon layer, as a fill layer, as shown in FIG. 6a.

Figure 7:
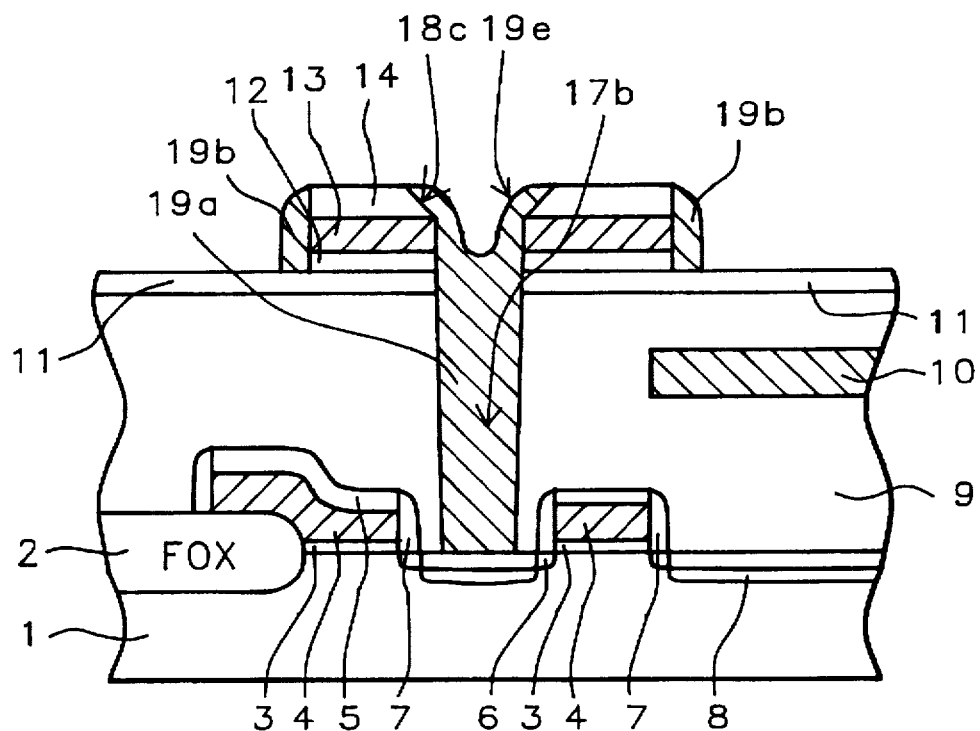
Figure 8:
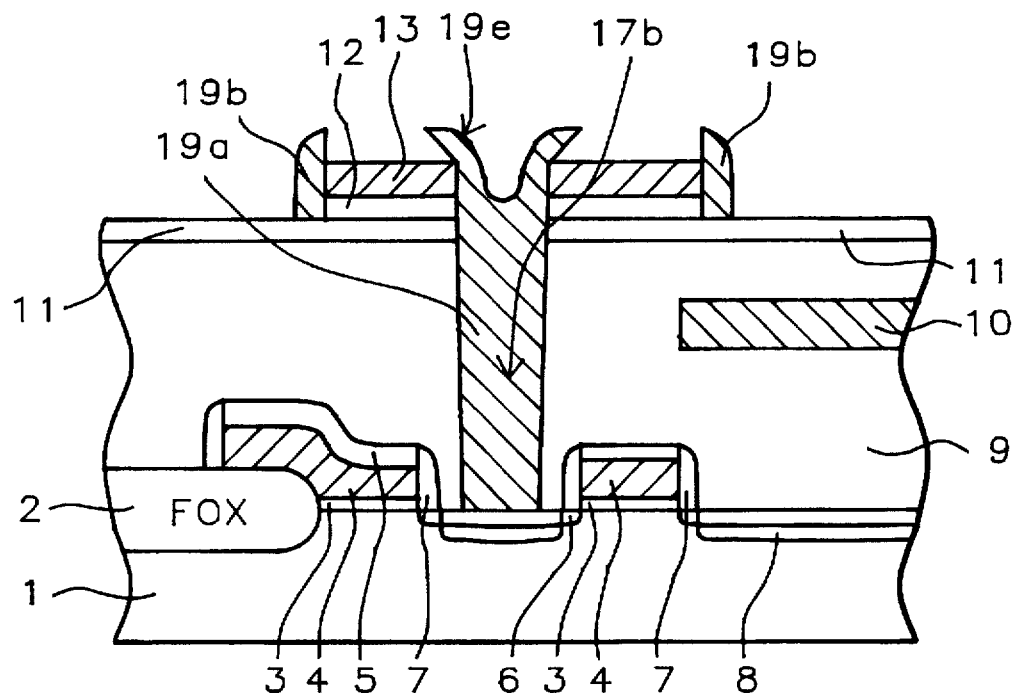

An anisotropic RIE procedure is next used to remove unwanted second polysilicon layer 19a from the top surface of second silicon oxide layer 14 using Cl$_2$ or HBr as an etchant. This procedure results in the creation of polysilicon plug 19a, in storage node contact hole 17b, while also resulting in the formation of polysilicon spacers 19b, created on the sides of the multi-layered stack structure. This is shown schematically in FIG. 7, in addition the anisotropic RIE procedure results in protruding polysilicon shapes 19e, extending along the sides of the straight walled, isotropic profile 18c, in second silicon oxide layer 14. The removal of second silicon oxide layer 14, via use of a buffered hydrofluoric acid solution, results in the "twin hammer tree" shaped storage node structure, shown schematically in FIG. 8. Each "hammer" consists of a "hammer head" or polysilicon spacer 19b, with a "hammer handle", or first polysilicon layer 13, connected to polysilicon plug 19a, in storage node contact hole 17b.

Figure 9:
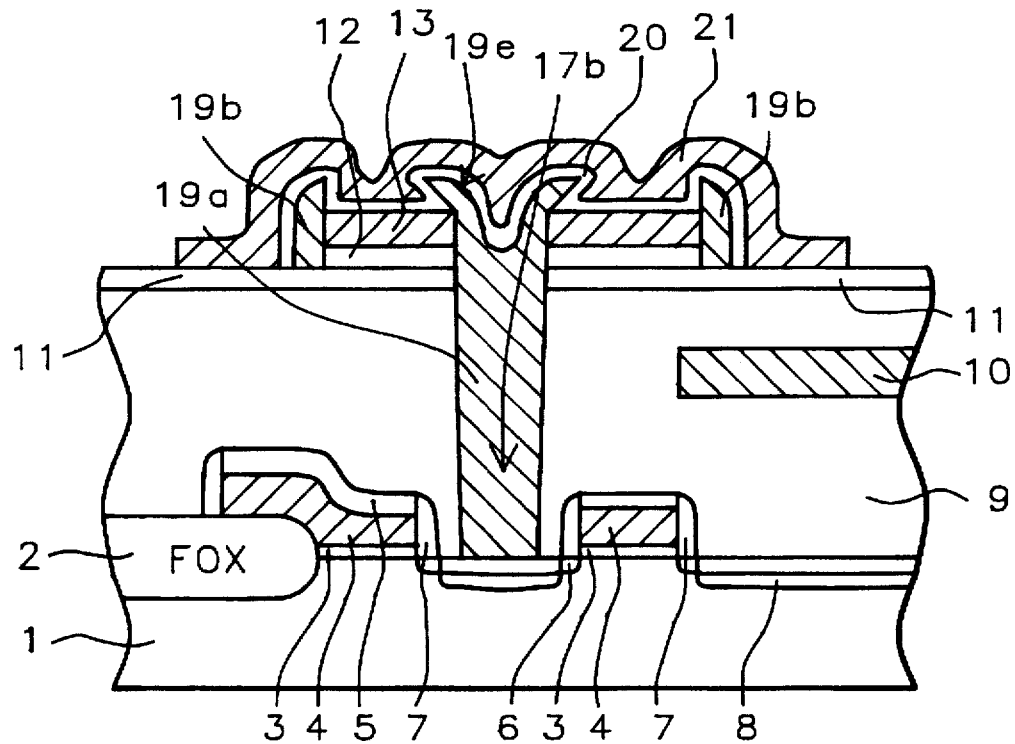
Figure 10A:
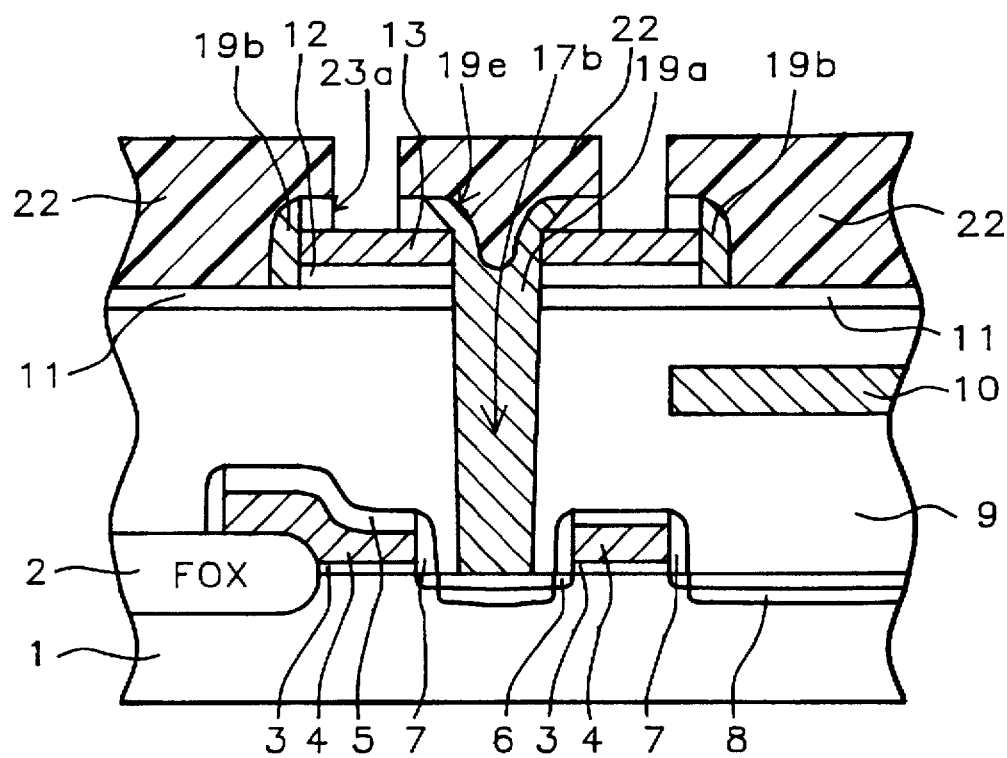
FIGS. 10a–10b, 11–12, which schematically, in cross-sectional style, show the key stages of fabrication used to for an enhancement of the first embodiment of this invention.
Figure 10B:
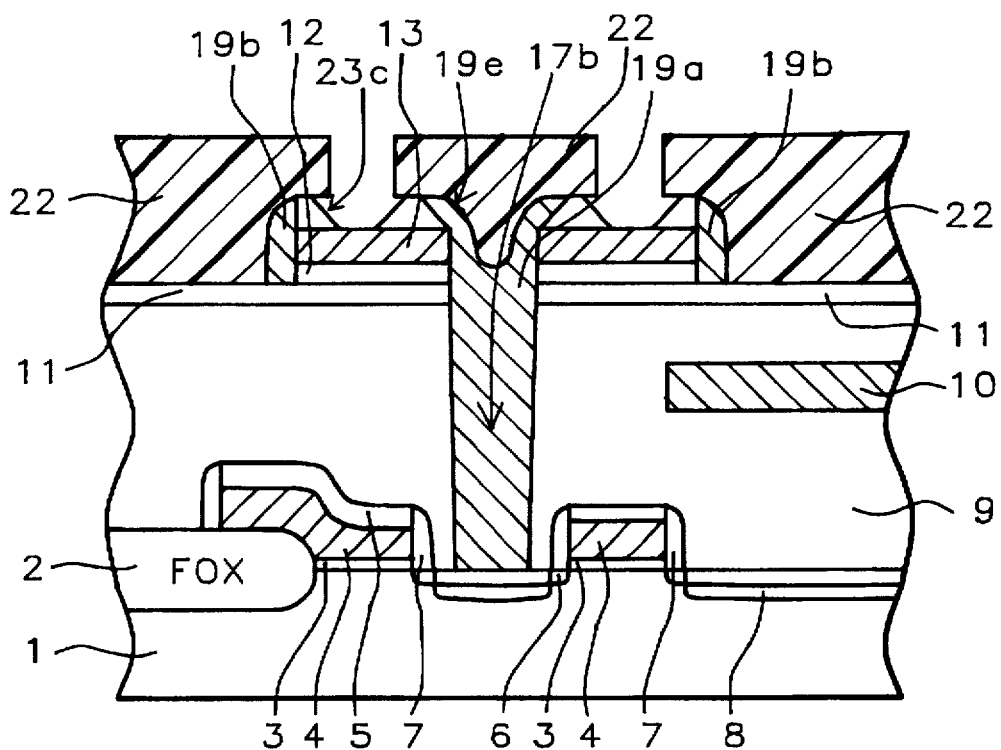

FIG. 9, schematically shows the completion of the capacitor structure, using the "twin hammer tree" shaped storage node structure. A capacitor dielectric layer 20, comprised of either Ta$_2$O$_5$ or an oxidized silicon nitride layer, on silicon dioxide, (ONO), is used, at an equivalent silicon oxide thickness between about 25 to 75 Angstroms. A third polysilicon layer is next deposited, using LPCVD procedures, to a thickness between about 800 to 3500 Angstroms. Third polysilicon layer can either be deposited incorporating in situ doping procedures, via the addition of either arsine or phosphine, to a silane ambient, or third polysilicon layer can be deposited intrinsically, and doped via either arsenic or phosphorous ion implantation procedures. Patterning of third polysilicon layer is accomplished via standard photolithographic procedures, and anisotropic RIE, using Cl$_2$ or HBr, as an etchant, creating polysilicon plate 21.

Figure 11:
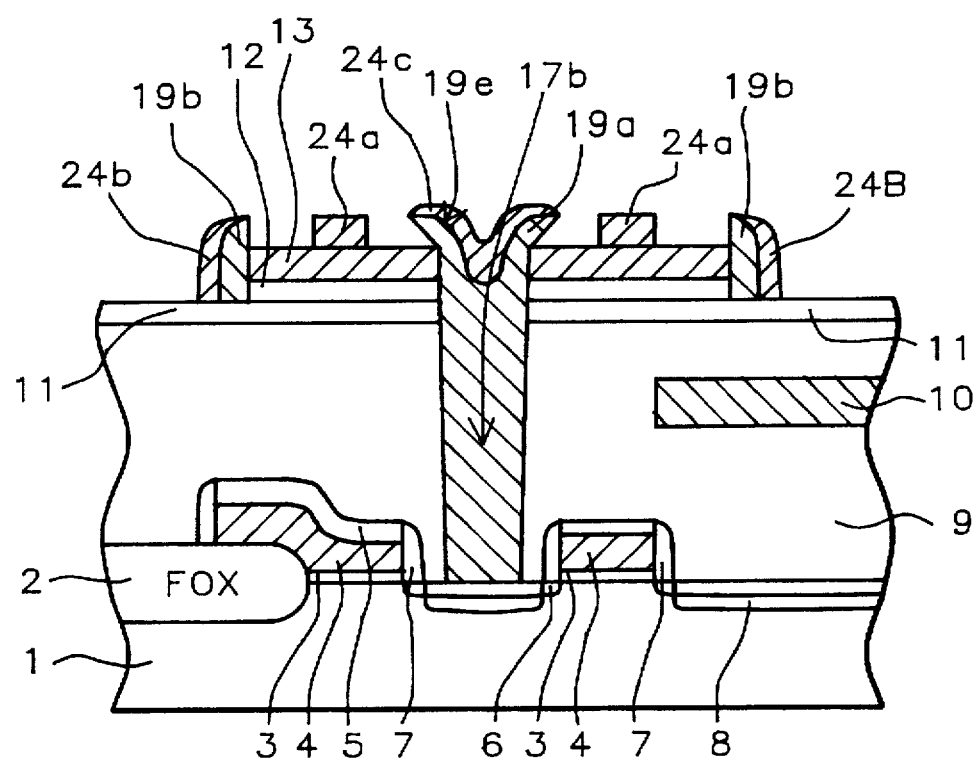
Figure 12:
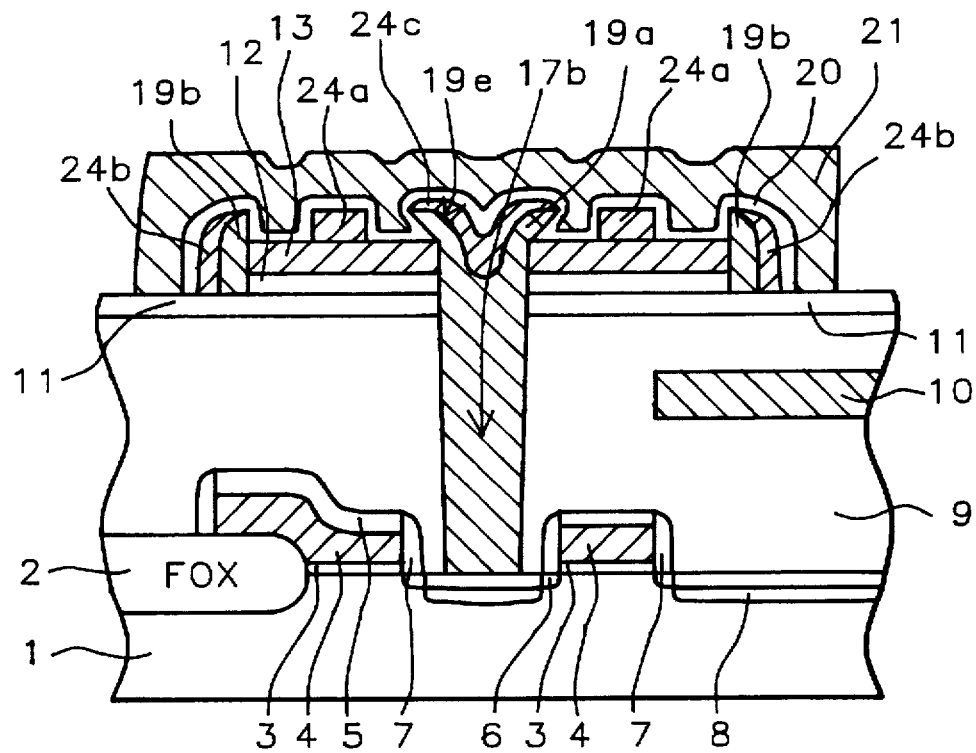

An enhancement, in terms of additional surface area increases, of the "twin hammer tree" shaped storage node structure, is next described using FIGS. 10a, 10b, 11-12. Referring back to the structure shown in FIG. 7, a photoresist shape 22, is used to allow openings to be made in second silicon oxide layer 14. The openings can be performed via RIE procedures, again using a single fluorocarbon gas, or a mixture of fluorocarbon gases, chosen from a group that includes CHF$_3$, CF$_4$, C$_2$F$_6$, C$_3$F$_8$, and C$_4$F$_8$, as an etchant, and using conditions previously described with FIGS. 5a–5c, creating a straight walled, anisotropic profile 23a, in second silicon oxide layer 14, shown schematically in FIG. 10a, or a straight walled, isotropic profile 23c, in second silicon oxide layer 14, shown schematically in FIG. 10b. The rounded, isotropic profile, in second silicon oxide layer 14, can also be created if desired. After removal of photoresist shape 22, via plasma oxygen ashing and careful wet cleans, a fourth polysilicon layer is deposited, using LPCVD procedures, to a thickness between 1500 to 5000 Angstroms. Anisotropic RIE procedures, using Cl$_2$, or HBr, as an etchant, are used to create polysilicon shapes 24a, on "hammer handle", or first polysilicon layer 13. The addition of polysilicon shapes 24a, increases the surface area of the "twin hammer tree" shaped storage node structure. The polysilicon deposition and anisotropic RIE procedures, also result in the formation of polysilicon spacers 24b, on the "hammer heads" or polysilicon spacers 19b, while also resulting in the creation of polysilicon layer 24c, on the polysilicon plug 19a, in storage node contact hole 17b. FIG. 11, shows this structure after removal of second silicon oxide layer 14, using a buffered hydrofluoric acid solution. The completion of the capacitor structure, featuring the enhanced, "twin hammer tree" shaped storage node structure, is schematically shown in FIG. 12. Capacitor dielectric layer 20, and polysilicon plate shape 21, are created using the identical procedures, previously described for the capacitor structure shown in FIG. 9.

Figure 13:
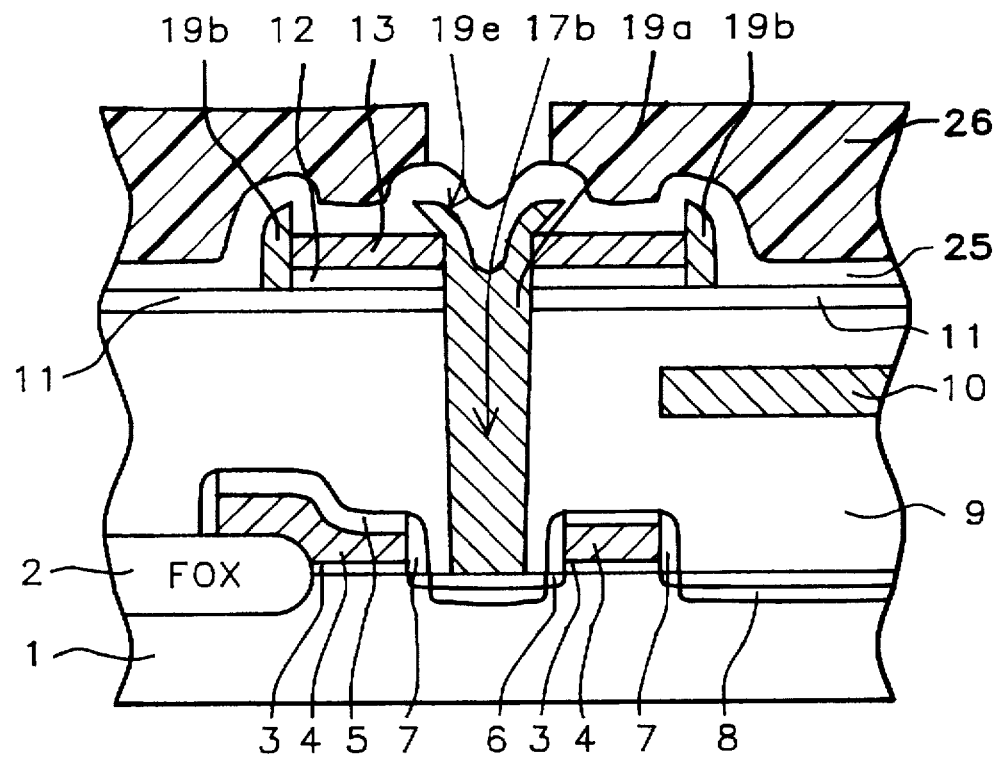
FIGS. 13–16, which schematically, in cross-sectional style, show the key stages of fabrication for a second embodiment of this invention.
Figure 14:
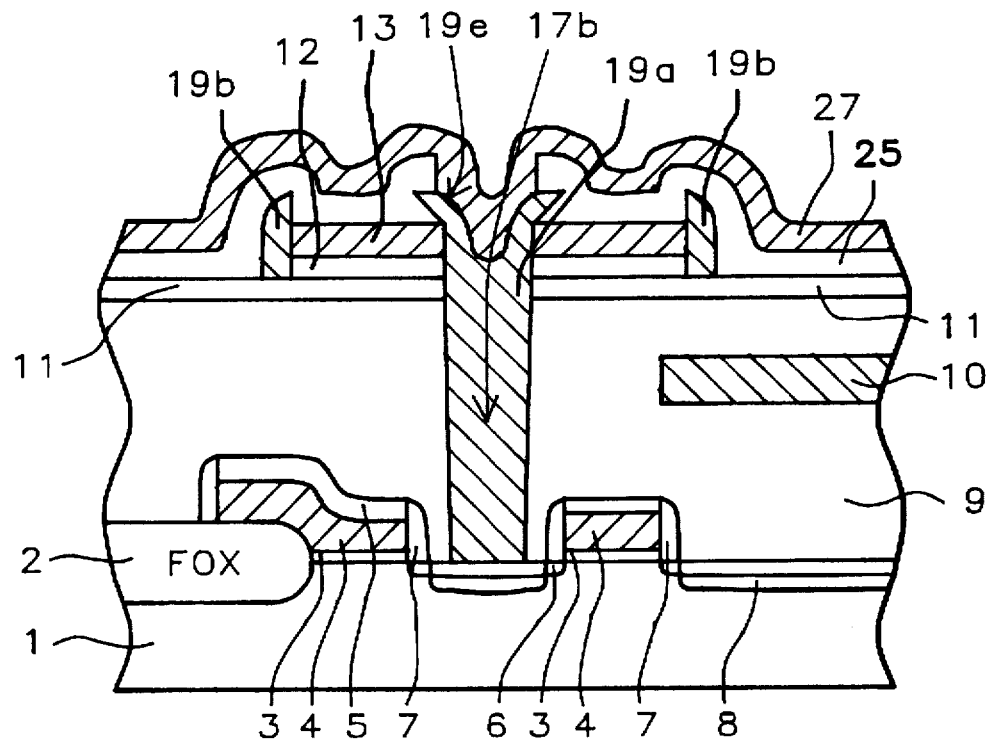
Figure 15:
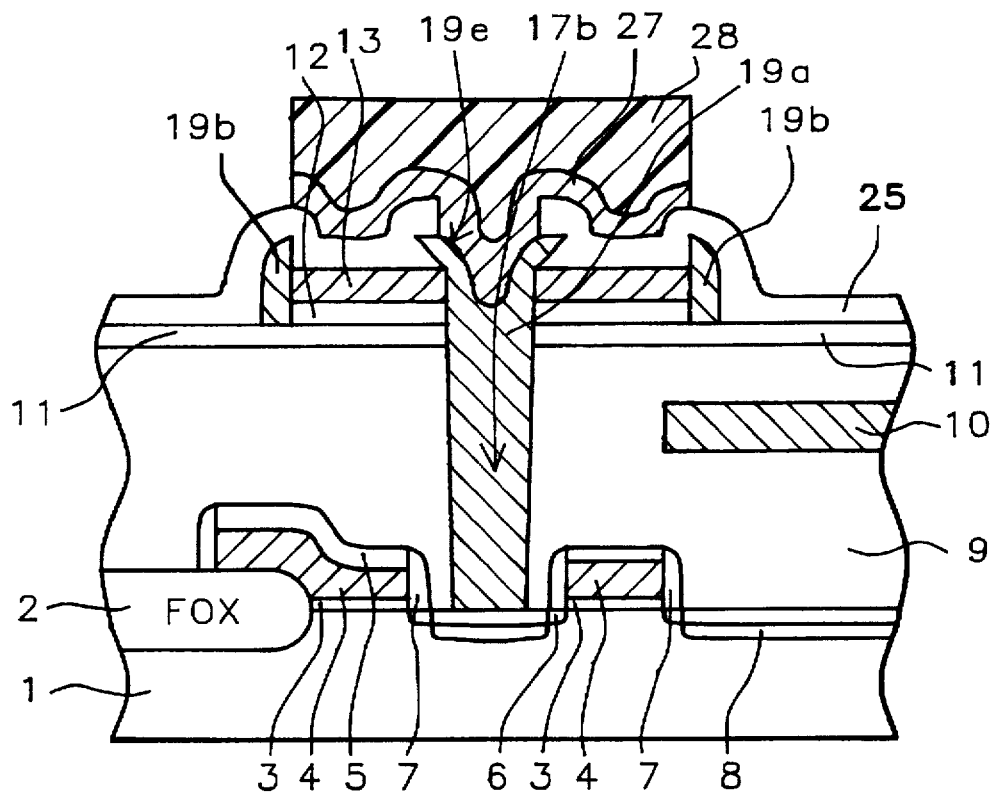
Figure 16:
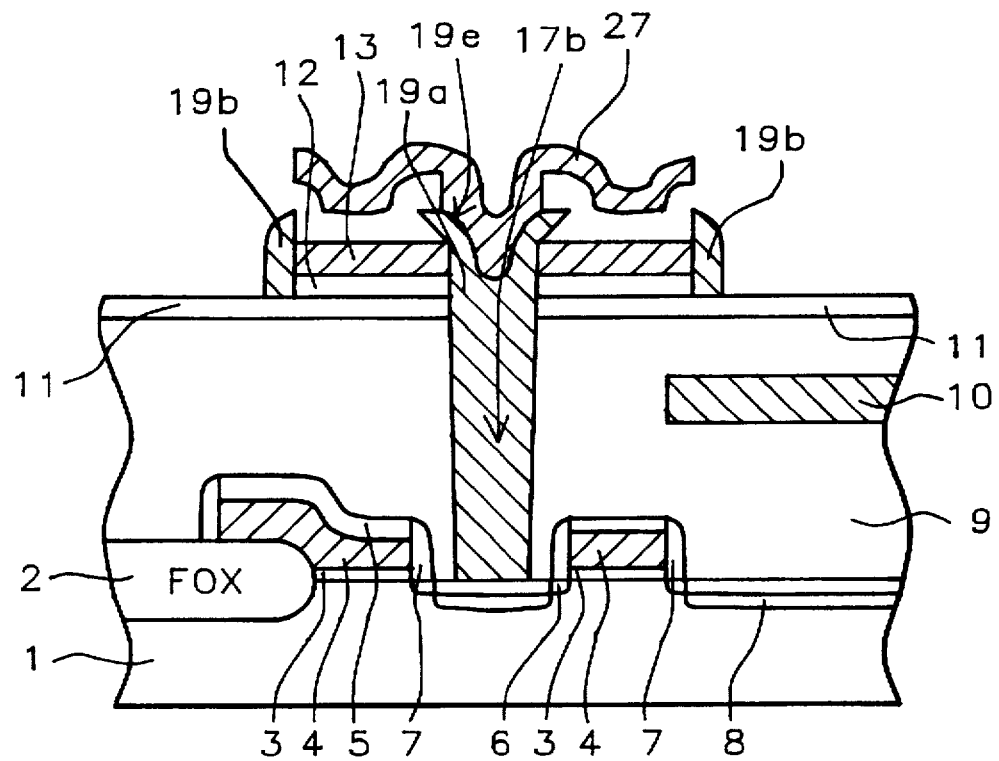

A second iteration of this invention, the creation of polysilicon "branches", again designed to increase storage node surface area, is schematically described using FIGS. 13–16. Referring back to the "twin hammer tree" shaped storage node structure, previously shown in FIG. 8, a third silicon oxide layer 25, is deposited, using LPCVD, PECVD, APCVD or SACVD procedures, to a thickness between about 1000 to 5000 Angstroms, using tetraethylorthosilicate, (TEOS), or silane, as a source. This is schematically shown in FIG. 13. A photoresist shape 26, is used as a mask to open a hole in third silicon oxide layer 25, exposing the top surface of polysilicon plug 19a, in the storage node contact hole 17b. After removal of photoresist shape 26, using plasma oxygen ashing and careful wet cleans, a fourth polysilicon layer 27, shown schematically in FIG. 14, is deposited via LPCVD procedures to a thickness between about 800 to 3500 Angstroms. Fourth polysilicon layer 27, is again doped using either in situ doping, or intrinsically and doped via ion implantation procedures. Another photoresist shape 28, is used as a mask to define the desired shape in fourth polysilicon layer 27, via anisotropic RIE procedures, using Cl$_2$, or HBr, as an etchant. This is shown schematically in FIG. 15. After removal of photoresist shape 28, again via plasma oxygen ashing and careful wet cleans, a buffered hydrofluoric acid solution is used to remove third silicon oxide layer 25. The removal of third silicon oxide 25, results in the creation of a polysilicon "branch" originating from fourth polysilicon layer 27, and connected to the underlying "twin hammer tree" shaped storage node structure, at the top surface of the polysilicon plug 19a. This extension to the "twin hammer tree" shaped storage node structure, results in increases in capacitor surface area. This structure is schematically shown in FIG. 16. Additional, overlying branches can be fabricated, to further increase capacitor surface area, if desired.

Figure 17:
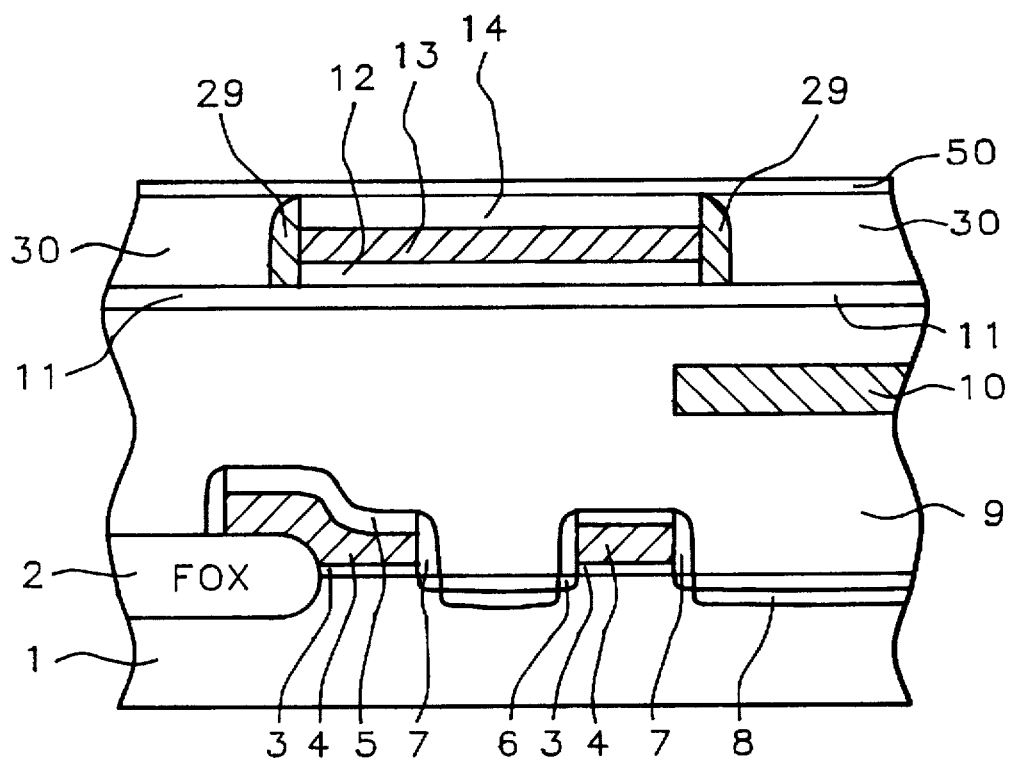
FIGS. 17–21, which schematically, in cross-sectional style, show the key stages of fabrication for a third embodiment of this invention.
Figure 18:
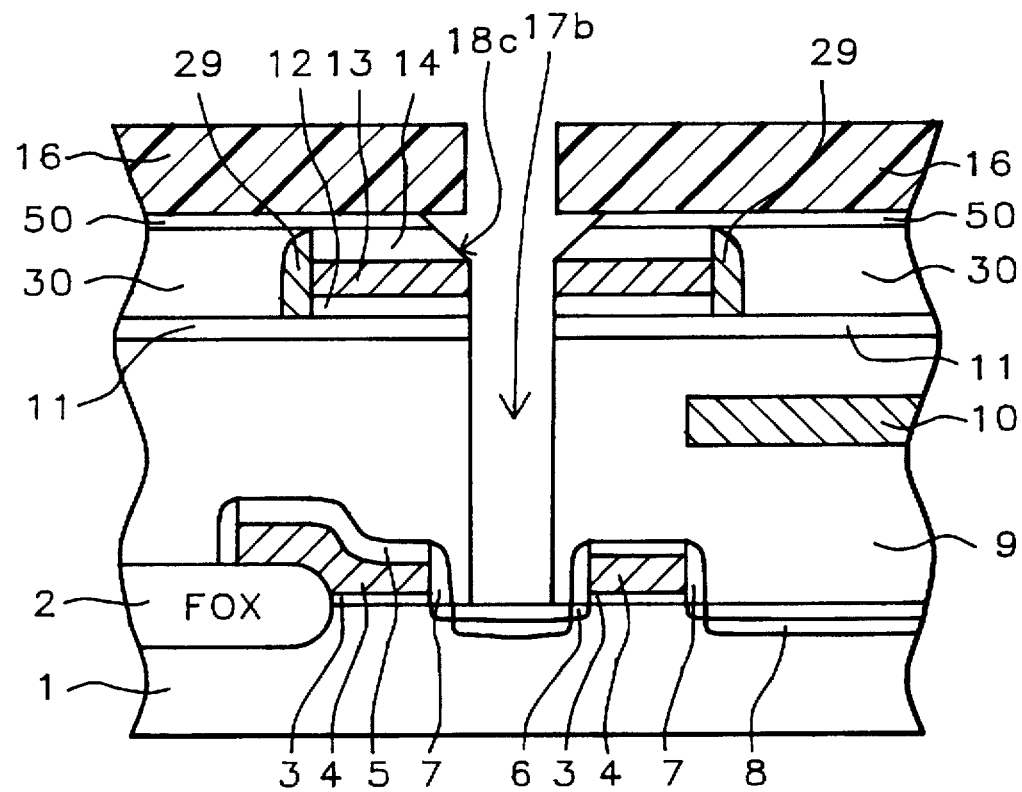
Figure 19:
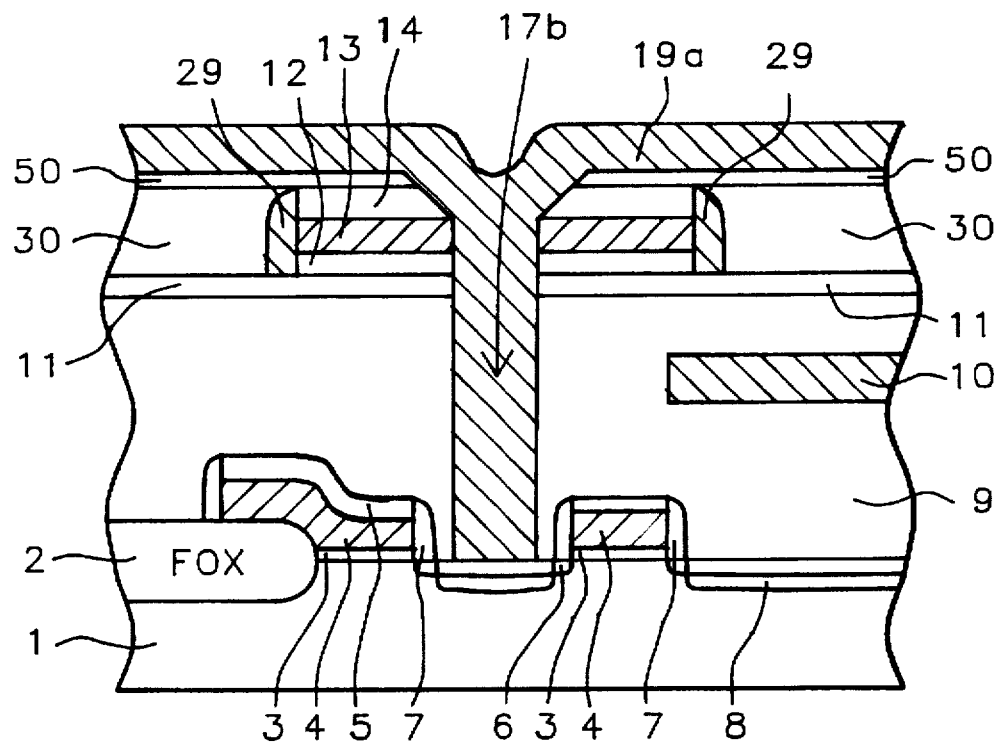
Figure 20:
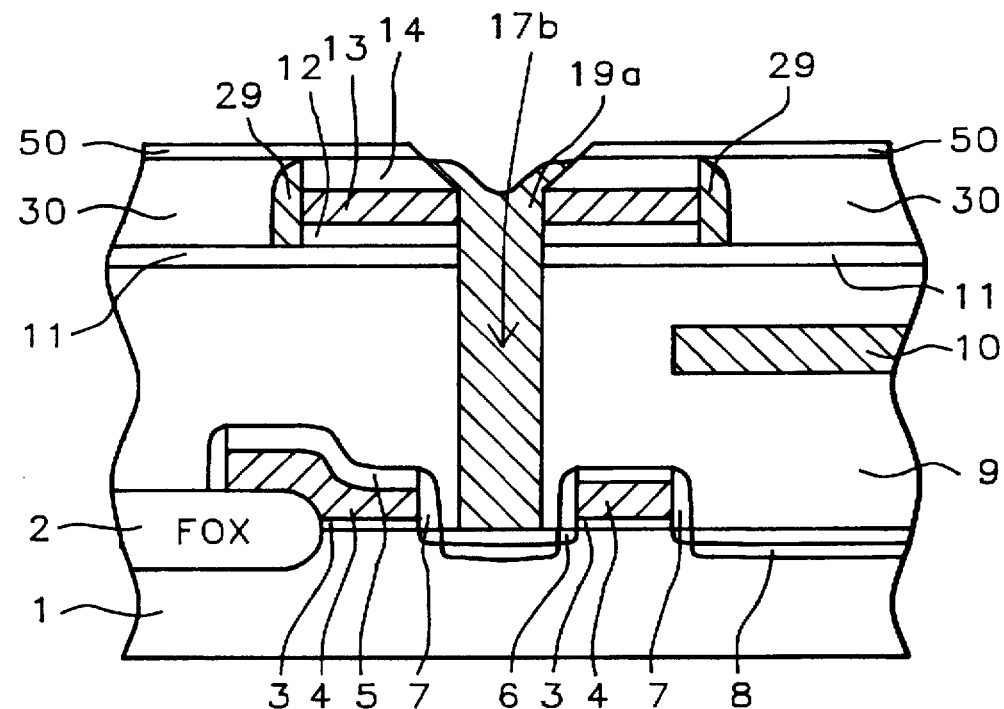
Figure 21:
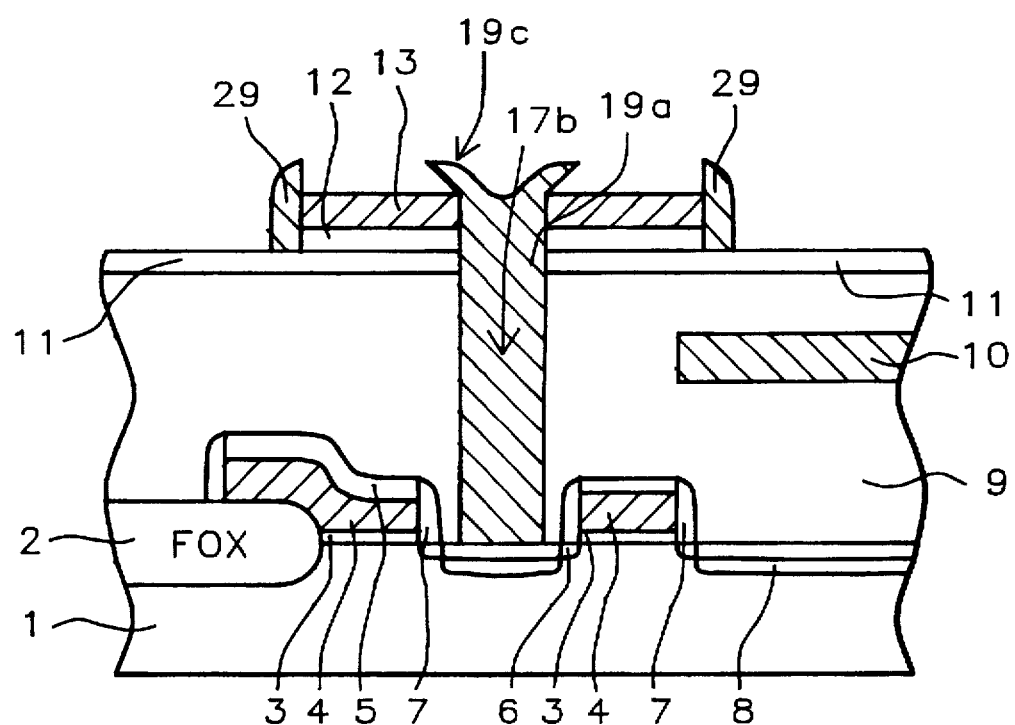

A third iteration of this invention, using a SOG layer to reduce the process complexity of forming the polysilicon plug, in terms of polysilicon etch back, is described using FIGS. 17–21. Referring back to the structure shown schematically in FIG. 3, polysilicon spacers 29, are formed on the sides of the stacked structure. In the previous iterations the polysilicon spacers were formed simultaneously with the formation of the polysilicon plug. A SOG application is next performed, filling the spaces between stacked structures. SOG layer 30, is applied to a thickness between about 3000 to 5000 Angstroms. This is shown schematically in FIG. 17. Also shown in FIG. 17, is an overlying third silicon oxide layer 50, deposited using PECVD or LPCVD procedures, to a thickness needed to protect polysilicon spacers 29, from subsequent polysilicon etch back, or CMP procedures. Third silicon oxide layer 50, offers additional protection for cases in which SOG layer 30, is ineffective in filling the space between polysilicon spacers 29. The opening of storage node contact hole 17b, is performed using a procedure identical to the procedure previously used, and schematically described in FIG. 5c, resulting in the straight walled, isotropic profile 18c, in second silicon oxide layer 14. This is schematically shown in FIG. 18. Polysilicon layer 19a, is deposited using LPCVD procedures, to a thickness between about 1000 to 5000 Angstroms, and doped using conditions previously described for the doping of polysilicon layer 19a. This is shown schematically in FIG. 19. The removal of unwanted polysilicon layer, from the top surface of third silicon oxide layer 50, is next addressed via use of either a chemical mechanical polishing procedure, or via use of a selective, anisotropic RIE procedure, using $Cl_2$, or HBr, as an etchant. Both removal procedures are simplified as a result of the smooth topography created with the use of SOG layer 30. FIG. 20, shows the result of an anisotropic RIE procedure. Removal of third silicon oxide layer 50, second silicon oxide layer 14, and SOG layer 30, using a buffered hydrofluoric acid solution, results in the "twin hammer tree" shaped storage node structure, schematically shown in FIG. 21.

While this invention has been shown and described with reference to, the preferred embodiments thereof, it will be understood by those skilled in the art that various changes in form and details may be made without departing from the spirit and scope of this invention.

What is claimed is:

1. A method of fabricating a capacitor structure for a dynamic random access memory DRAM device, in which a shape of a storage node structure, of the capacitor structure, is configured to increase a surface area of the storage node structure, comprising the steps of:

providing a transfer gate transistor, for said DRAM device;

depositing a first insulator layer on said transfer gate transistor;

depositing a silicon nitride layer on said first insulator layer;

forming a multi-layered stack, on said silicon nitride layer, comprising an underlying, first silicon oxide layer, a first polysilicon layer, and an overlying, second silicon oxide layer;

opening a storage node contact hole, in said multi-layered stack, in said silicon nitride layer, and in said first insulator layer, exposing a top surface of a source and drain region, of said transfer gate transistor;

depositing a second polysilicon layer, completely filling said storage node contact hole, then forming a polysilicon plug, in said storage node contact hole, via anisotropic etching, removing said second polysilicon layer from a top surface of said multi-layered stack, while also forming polysilicon spacers on sidewalls of said multi-layered stack;

removing said overlying, second silicon oxide layer, resulting in a lower level, polysilicon shape, comprised of said polysilicon plug, in said storage node contact hole, connected to polysilicon slabs, one at each side, formed from said first polysilicon layer, and with said polysilicon spacers, on sidewalls of said polysilicon slabs;

depositing a second insulator layer, on said lower level, polysilicon shape;

opening a hole in said second insulator layer, exposing a top surface of said polysilicon plug, in said storage node contact hole;

depositing a third polysilicon layer on said second insulator layer, and contacting the top surface of said polysilicon plug, in said hole in said second insulator layer;

patterning of said third polysilicon layer to create an upper level, polysilicon shape, on said second insulator layer, contacting the top surface of said polysilicon plug, in said storage node contact hole;

removing said second insulator layer, resulting in the storage node structure, comprised of said upper level, polysilicon shape, connected to said lower level polysilicon shape;

forming a capacitor dielectric layer on said storage node structure; and forming an upper electrode, for said capacitor structure.

2. The method of claim 1, wherein said multi-layered stack is comprised of said first silicon oxide layer, deposited using low pressure chemical vapor deposition LPCVD or plasma enhanced chemical vapor deposition PECVD procedures, to a thickness between about 1000 to 4000 Angstroms, said first polysilicon layer, deposited using LPCVD procedures, to a thickness between about 500 to 2500 Angstroms, and said second silicon oxide layer, deposited using LPCVD or PECVD procedures, to a thickness between about 1500 to 4000 Angstroms.

3. The method of claim 1, wherein the opening in said multi-layered stack, for said storage node contact hole, is formed using anisotropic reactive ion etch RIE procedures, using a single fluorocarbon gas, or a mixture of fluorocarbon gases chosen from a group consisting of $CHF_3$, $CF_4$, $C_2F_6$, $C_3F_8$, and $C_4F_8$, as an etchant, creating a straight walled, anisotropic profile, of about 90° in said second silicon oxide layer.

4. The method of claim 1, wherein the opening in said multi-layered stack, for said storage node contact hole, is formed using isotropic RIE procedures, using either $CF_4$, $CHF_3$, $SF_6$, or $NF_3$, at a pressure between about 600 to 1000 milliTorr, creating a straight walled, isotropic profile, of about 45° in said second silicon oxide layer.

5. The method of claim 1, wherein the opening in said multi-layered stack, for said storage node contact hole is formed via isotropic RIE procedures using $CF_4$, $SF_6$, or $NF_3$, as an etchant, at a pressure greater than 1000 milliTorr, creating a rounded, isotropic profile, in said second silicon oxide layer.

6. The method of claim 1, wherein said storage node contact hole has a diameter between about 0.25 to 1.0 micrometers.

7. The method of claim 1, wherein said second polysilicon layer is deposited using LPCVD procedures, to a thickness between about 1500 to 5000 Angstroms, and deposited using in situ doping procedures.

8. The method of claim 1, wherein said polysilicon plug, and said polysilicon spacers, are formed via anisotropic RIE procedure of said second polysilicon layer, using $Cl_2$, or HBr, as an etchant.

9. The method of claim 1, wherein said second insulator layer is silicon oxide, deposited using LPCVD, PECVD, atmospheric pressure chemical vapor deposition (APCVD) or sub-atmospheric chemical vapor deposition (SACVD) procedures, to a thickness between about 1500 to 4000 Angstroms, using tetraethylorthosiliate (TEOS), or silane as a source.

10. The method of claim 1, wherein said third polysilicon layer is deposited using LPCVD procedures, to a thickness between about 800 to 3500 Angstroms, grown using in situ doping procedures, or grown intrinsically and doped via ion implantation procedures.

11. The method of claim 1, wherein said upper level polysilicon shape is formed via an anisotropic RIE procedure of said third polysilicon layer, using $Cl_2$, or HBr, as an etchant.

12. A method of fabricating a capacitor structure, for a DRAM device, in which a "twin hammer tree" shaped, storage node structure, is used to increase a surface area of the storage node structure, comprising the steps of:

providing a transfer gate transistor, for said DRAM device;

depositing a first insulator layer on said transfer gate transistor;

depositing a silicon nitride layer on said first insulator layer;

depositing a first silicon oxide layer on said silicon nitride layer;

depositing a first polysilicon layer on said first silicon oxide layer;

depositing a second silicon oxide layer on said first polysilicon layer;

patterning to create a multi-layered stack of said second silicon oxide layer, of said first polysilicon layer, and of said first silicon oxide layer, on said silicon nitride layer;

opening a storage node contact hole in said multi-layered stack, in said silicon nitride layer, and in said first insulator layer, exposing a top surface of a source and drain region of said transfer gate transistor;

depositing a second polysilicon layer, completely filling said storage node contact hole;

anisotropic etching of said second polysilicon layer, to form a polysilicon plug, in said storage node contact hole, and to form polysilicon spacers on sides of said multi-layered stack;

wet etching to remove said second silicon oxide layer, resulting in a "twin hammer tree" shaped, polysilicon structure, comprised of said polysilicon plug, connected to a "hammer" shaped polysilicon structure, on each side, with said "hammer" shaped polysilicon structure consisting of a polysilicon slab, created from said first polysilicon layer, and with a polysilicon spacer attached to an end of said polysilicon slab;

depositing a second insulator layer on said "twin hammer tree" shaped polysilicon structure;

opening a hole in said second insulator layer, exposing a top surface of said polysilicon plug;

depositing a third polysilicon layer on said second insulator layer, and on the top surface of said polysilicon plug, exposed in the hole in said second insulator layer;

patterning said third polysilicon layer to create a polysilicon "branch", on said second insulator layer, and contacting said polysilicon plug, in the hole in said second insulator layer;

removing said second insulator layer, resulting in said "twin hammer tree" shaped, storage node structure, comprised of said underlying, "twin hammer tree" shaped, polysilicon structure, and a connecting, overlying, said polysilicon "branch";

forming a capacitor dielectric layer on exposed surfaces of said "twin hammer tree" shaped, storage node structure;

depositing a fourth polysilicon layer; and patterning of said fourth polysilicon layer, to create an upper plate for said capacitor structure, of the DRAM device.

13. The method of claim 12, wherein said first polysilicon layer is deposited using LPCVD procedures, to a thickness between about 500 to 2500 Angstroms, and doped using either in situ doping deposition procedures, or via ion implantation of an intrinsically grown first polysilicon layer.

14. The method of claim 12, wherein said second silicon oxide layer is deposited using LPCVD, PECVD, APCVD, or SACVD procedures, to a thickness between about 1500 to 4000 Angstroms.

15. The method of claim 12, wherein a straight walled, anisotropic profile, of about 90° is formed in said second silicon oxide layer, via anisotropic RIE procedures, using a single fluorocarbon gas, or a mixture of fluorocarbon gases, as an etchant.

16. The method of claim 12, wherein a straight walled, isotropic profile, at an angle of about 45°, is formed in said second silicon oxide layer, via RIE procedures, using either $CF_4$, $SF_6$, $NF_3$, or $CHF_3$ as an etchant, at a pressure between about 600 to 1000 milliTorr.

17. The method of claim 12, wherein a rounded, isotropic profile is formed in said second silicon oxide layer, via RIE procedures, using either $CF_4$, $SF_6$, or $NF_3$, as an etchant, at a pressure greater than 1000 milliTorr.

18. The method of claim 12, wherein said storage node contact hole is formed with a diameter between about 0.25 to 1.0 micrometers.

19. The method of claim 12, wherein said second polysilicon is deposited using LPCVD procedures, to a thickness between about 1500 to 5000 Angstroms, and doped via in situ doping procedures.

20. The method of claim 12, wherein said "twin hammer tree" shaped, polysilicon structure is formed via anisotropic RIE of said second polysilicon layer, using $Cl_2$, or HBr, as an etchant, creating said polysilicon plug, in said storage node contact hole, and creating said polysilicon spacers, on the ends of said polysilicon slab.

21. The method of claim 12, wherein said second insulator layer is silicon oxide, deposited using either LPCVD, PECVD, APCVD, or SACVD procedures, to a thickness between about 1500 to 4000 Angstroms, using TEOS, or silane as a source.

22. The method of claim 12, wherein said third polysilicon layer is deposited intrinsically, using LPCVD procedures, to a thickness between about 800 to 3500 Angstroms, and doped using ion implantation procedures, or said third polysilicon layer is grown using in situ doping procedures.

23. The method of claim 12, wherein said polysilicon "branch" is formed via an anisotropic RIE procedure of said third polysilicon layer, using $Cl_2$, or HBr, as an etchant.

* * * * *